United States Patent
Mizuno

(10) Patent No.: US 8,941,092 B2
(45) Date of Patent: Jan. 27, 2015

(54) METHOD FOR FORMING SEMICONDUCTOR DEVICE STRUCTURE AND SEMICONDUCTOR DEVICE

(75) Inventor: Tomohisa Mizuno, Kanagawa (JP)

(73) Assignee: Kanagawa University, Kanagawa (JP)

( * ) Notice: Subject to any disclaimer, the term of this patent is extended or adjusted under 35 U.S.C. 154(b) by 0 days.

(21) Appl. No.: 13/412,296

(22) Filed: Mar. 5, 2012

(65) Prior Publication Data

US 2012/0168818 A1 Jul. 5, 2012

Related U.S. Application Data

(63) Continuation of application No. PCT/JP2010/065397, filed on Sep. 8, 2010.

(30) Foreign Application Priority Data

Sep. 9, 2009 (JP) ................... 2009-208652

(51) Int. Cl.
*H01L 29/06* (2006.01)
*H01L 31/00* (2006.01)
(Continued)

(52) U.S. Cl.
CPC .... *H01L 29/78654* (2013.01); *H01L 29/66742* (2013.01); *H01L 29/7848* (2013.01); *H01L 29/78618* (2013.01); *H01L 29/78684* (2013.01)
USPC .............. 257/12; 257/18; 257/183; 257/194; 438/217; 438/289

(58) Field of Classification Search
CPC ..................... H01L 21/823807; H01L 21/105; H01L 29/78687; H01L 29/7842
USPC ......... 438/142, 197, 199, 217, 289, 800, 931, 438/933, 938, FOR. 487; 257/18, 19, 12, 257/183, 194, E29.033
See application file for complete search history.

(56) References Cited

U.S. PATENT DOCUMENTS 4,607,429 A * 8/1986 Kosonocky .................... 438/79
5,153,683 A * 10/1992 Noda ............................ 257/282
(Continued)

FOREIGN PATENT DOCUMENTS

| JP | 10-12883 A | 1/1998 |
| JP | 10-209453 A | 8/1998 |

(Continued)

OTHER PUBLICATIONS

International Search Report for PCT/JP2010/065397, mailed Dec. 14, 2010.
(Continued)

*Primary Examiner* — Colleen A Matthews
*Assistant Examiner* — Quovaunda V Jefferson
(74) *Attorney, Agent, or Firm* — Hoffmann & Baron, LLP

(57) ABSTRACT

Disclosed are a method which improves the performance of a semiconductor element, and a semiconductor element with improved performance. The method for forming a semiconductor element structure includes a heterojunction forming step in which a heterojunction is formed between a strained semiconductor layer (21) in which a strained state is maintained, and relaxed semiconductor layers (23, 25). The heterojunction is formed by performing ion implantation from the surface of a substrate (50) which has a strained semiconductor layer (20) partially covered with a covering layer (30) on an insulating oxide film (40), and altering the strained semiconductor layer (20) where there is no shielding from the covering layer (30) to relaxed semiconductor layers (23, 25) by relaxing the strained state of the strained semiconductor layer (20), while maintaining the strained state of the strained semiconductor layer (21) where there is shielding from the covering layer (30).

16 Claims, 8 Drawing Sheets

(51) Int. Cl.
*H01L 29/786* (2006.01)
*H01L 29/66* (2006.01)
*H01L 29/78* (2006.01)

(56) References Cited

U.S. PATENT DOCUMENTS

| | | | |
|---|---|---|---|
| 5,648,672 A * | 7/1997 | Hasegawa et al. | 257/372 |
| 6,326,667 B1 * | 12/2001 | Sugiyama et al. | 257/347 |
| 7,279,430 B2 * | 10/2007 | Chang et al. | 438/723 |
| 7,335,545 B2 * | 2/2008 | Currie | 438/197 |
| 2002/0197803 A1 * | 12/2002 | Leitz et al. | 438/285 |
| 2005/0064665 A1 * | 3/2005 | Han | 438/286 |
| 2005/0167747 A1 | 8/2005 | Apel et al. | |
| 2006/0014366 A1 | 1/2006 | Currie | |
| 2006/0040503 A1 | 2/2006 | Chang et al. | |
| 2006/0160291 A1 * | 7/2006 | Lee et al. | 438/199 |
| 2006/0175608 A1 * | 8/2006 | Celler | 257/49 |
| 2008/0124858 A1 | 5/2008 | Nguyen et al. | |
| 2008/0315317 A1 * | 12/2008 | Lai et al. | 257/369 |

FOREIGN PATENT DOCUMENTS

| | | |
|---|---|---|
| JP | 2006-19727 A | 1/2006 |
| JP | 2007-520086 A | 7/2007 |
| JP | 2009-152391 A | 7/2009 |
| KR | 1020127004064 A | 3/2012 |
| WO | 2005/067058 A1 | 7/2005 |

OTHER PUBLICATIONS

Office Action mailed May 21, 2013 in Korean Patent Application No. 10-2012-7004064.
Notice of Reasons for Rejection issued to JP Application No. 2011-530849, mailed Sep. 17, 2013.

* cited by examiner

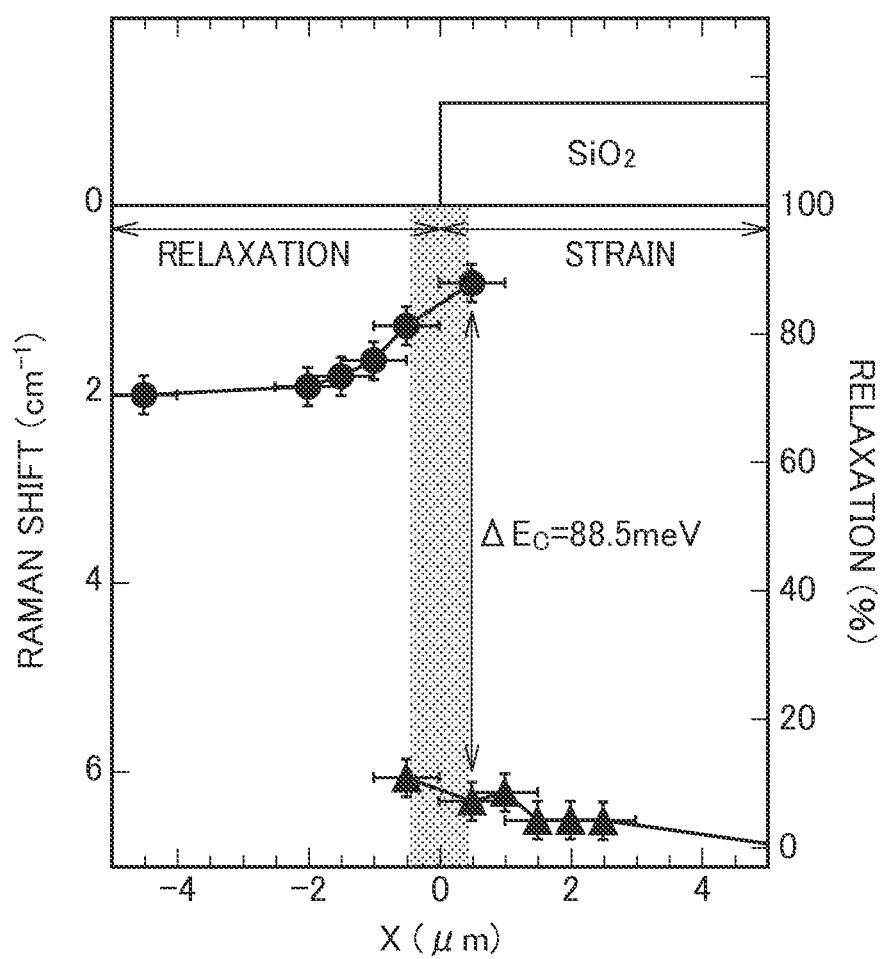

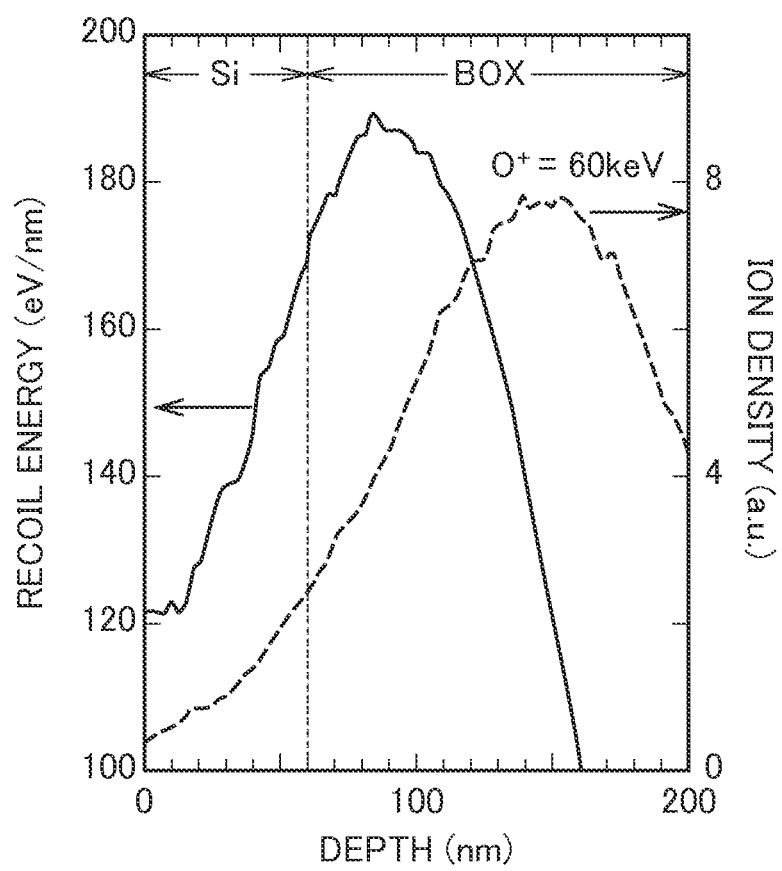

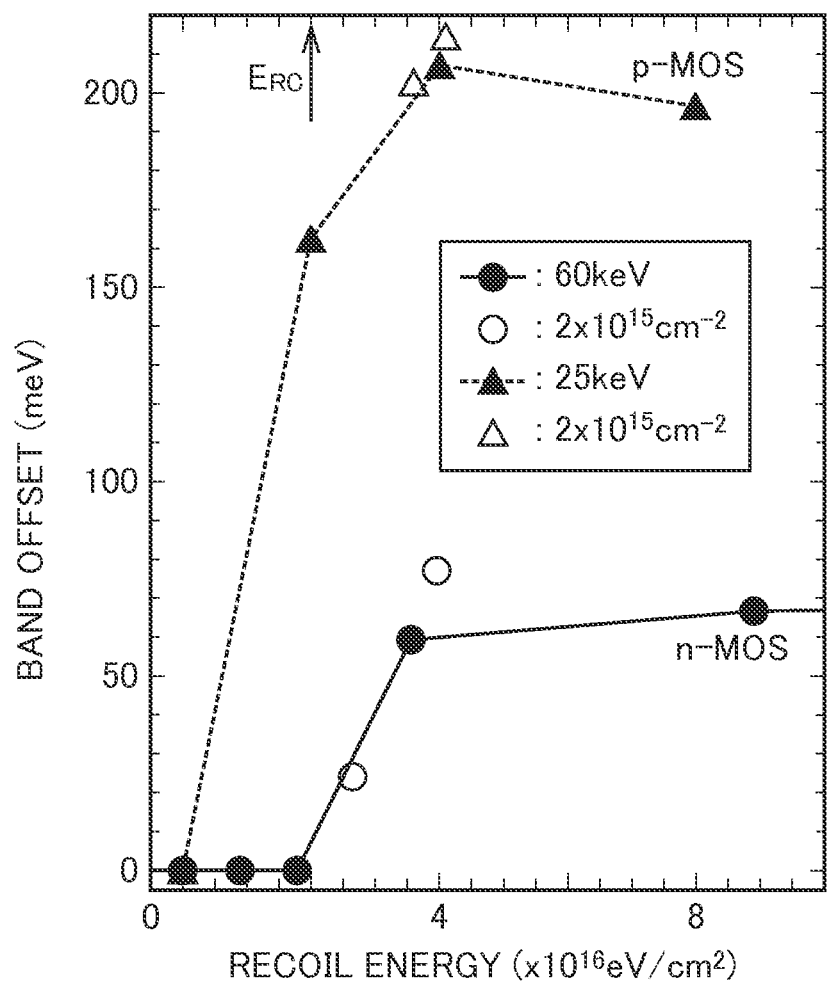

US 8,941,092 B2

METHOD FOR FORMING SEMICONDUCTOR DEVICE STRUCTURE AND SEMICONDUCTOR DEVICE

CROSS-REFERENCE TO RELATED APPLICATIONS

This application is a continuation of International Application No. PCT/JP2010/065397, filed Sep. 8, 2010, which claims the benefit of Japanese Application No. 2009-208652, filed Sep. 9, 2009, the contents of both of which are incorporated by reference herein in their entirety.

TECHNICAL FIELD

The present invention relates to a method for forming a semiconductor device structure and a semiconductor device.

BACKGROUND ART

MOSFET (Metal Oxide Semiconductor Field Effect Transistor) is a field effect transistor that is most widely used in LSI.

FIG. 8 is a schematic configuration diagram of a conventional n-type MOSFET 900. The n-type MOSFET 900 is provided with: a source 901 and a drain 930 composed of relaxed SiGe; and a channel 920 composed of strained Si, in which a heterojunction is formed between a SiGe layer and a Si layer (see Patent Document 1). A gate electrode 943 is provided on the channel 920 via a gate insulating film 941. The n-type MOSFET is expected to operate at ultra high speed by applying a predetermined voltage to the gate electrode 943 of the gate 940.

Patent Document 1: Japanese Unexamined Patent Application (Translation of PCT Application), Publication No. 2007-520086

DISCLOSURE OF THE INVENTION

Problems to be Solved by the Invention

However, in the conventional n-type MOSFET 900, especially Ge atoms in the source 910 diffuse into the channel 920 and the heterostructure between the source 910 and the channel 920 becomes gradient, thereby degrading performance of the MOSFET.

The present invention is made in view of the abovementioned situation and is aimed at providing a method for forming a semiconductor device structure that can improve performance of a semiconductor device, and a semiconductor device of improved performance.

Means for Solving the Problems

The present inventor found that various problems due to diffusion of foreign atoms can be solved by forming a heterojunction between a strained layer and a relaxed layer of the same material, thus leading to completion of the present invention. More specifically, the present invention provides the following.

In a first aspect of the present invention, a method for forming a semiconductor device structure includes a heterojunction forming step in which: ion implantation is performed from an upper surface of a substrate in which a strained semiconductor layer partially having a covering layer is provided on an insulating oxide layer, to maintain a strained state of a first part of the strained semiconductor layer shielded by the covering layer and to relax the strained state of a second part of the strained semiconductor layer not shielded by the covering layer and the second part is changed into a relaxed semiconductor layer, thereby forming a heterojunction between the strained semiconductor layer maintaining the strained state and the relaxed semiconductor layer.

According to the invention in the first aspect, by performing ion implantation from above the surface of the substrate in which the strained semiconductor layer partially having the covering layer is provided on the insulating oxide layer, a heterojunction is formed between the strained semiconductor layer and the relaxed semiconductor layer composed of the same semiconductor material. As a result, various problems due to diffusion of foreign atoms are solved and performance of the semiconductor device can be improved.

According to a second aspect of the present invention, in the method as described in the first aspect, the covering layer has an oxide layer composed of an oxide of the semiconductor.

According to a third aspect of the present invention, in the method as described in the second aspect, the covering layer further comprises a gate electrode that covers the oxide layer.

According to the invention in the second or third aspect, at least a gate portion of the formed semiconductor device structure can be used in the semiconductor structure, by only forming a gate electrode, or even as-is. As a result, usability of the semiconductor device structure can be increased.

According to a fourth aspect of the present invention, in the method as described in any one of the first to third aspects, the covering layer is in a single layer structure composed of a material with a thermal expansion rate greater or lower than that of the strained semiconductor layer.

According to a fifth aspect of the present invention, in the method as described in any one of the first to fourth aspects, the ion implantation is implantation of ions mainly or entirely composed of an element other than a dopant.

According to a sixth aspect of the present invention, in the method as described in any one of the first to fifth aspects, the ion implantation is implantation of ions mainly or entirely composed of an element composing the insulating oxide layer and the strained semiconductor layer.

According to the invention in the fifth or sixth aspect, a negative effect of ion implantation characteristic of the semiconductor layer is reduced, thereby stabilizing performance of the semiconductor device.

According to a seventh aspect of the present invention, in the method as described in any one of the first to sixth aspects, the strained semiconductor layer is composed of Si or SiGe.

According to an eighth aspect of the present invention, in the method as described in the seventh aspect, the strained semiconductor layer is composed of tensile strained Si or compressive strained SiGe.

According to the invention in the eighth aspect, by configuring the strained semiconductor layer with tensile strained Si, a semiconductor device structure for n-MOS can be formed; and by configuring the strained semiconductor layer with compressive strained SiGe, a semiconductor device structure for p-MOS can be formed.

According to a ninth aspect of the present invention, in the method as described in the seventh or eighth aspect, the ion implantation is implantation of ions mainly or entirely composed of at least one element selected from a group consisting of O, Si and Ge.

According to a tenth aspect of the present invention, in the method as described in the seventh or eighth aspect, the ion implantation is implantation of ions mainly or entirely composed of at least one element selected from a group consisting of H, He, Li, Be and C.

In an eleventh aspect of the present invention, the method as described in any one of the first to tenth aspects further includes an annealing step after the ion implantation.

Energy upon ion implantation may cause severe damage to a semiconductor layer, giving a negative effect on performance of the semiconductor device.

However, according to the invention of the eleventh aspect, by performing annealing after the ion implantation, the semiconductor layer recovers from the damage and reduction in performance of the semiconductor device can be suppressed.

According to a twelfth aspect of the present invention, in the method as described in any one of the first to eleventh aspects, the ion implantation is performed from a direction at a predetermined angle to a direction orthogonal to a surface of the strained semiconductor layer.

According to the invention in the twelfth aspect, a part of the semiconductor layer on a drain side of a part covered by the covering layer, is masked from ion implantation and not relaxed, for a predetermined length according to the predetermined angle. As a result, a heterojunction on the drain side of the semiconductor device is spaced apart from a channel/drain interface and a band offset in the interface is reduced, allowing higher speed operation.

In a thirteenth aspect of the present invention, the method as described in the twelfth aspect further includes a step of adjusting energy of ion implantation according to the predetermined angle.

According to a fourteenth aspect of the present invention, in the method as described in any one of the first to thirteenth aspects, energy is adjusted such that a peak of recoil energy distribution of ions is theoretically positioned in an interface between the strained semiconductor layer and the insulating oxide layer.

As the peak of recoil energy distribution of ions is at least theoretically positioned in an interface between the strained semiconductor layer and the insulating oxide layer, transition from the strained semiconductor layer to the relaxed semiconductor layer takes place effectively and a heterojunction can be formed more reliably. In addition, as the recoil energy in the semiconductor layer is lower than the peak, damage to the semiconductor layer can be reduced.

In a fifteenth aspect of the present invention, the method as described in any one of the first to fourteenth aspects further includes a step of forming a source and a drain by doping the relaxed semiconductor layer, or the relaxed semiconductor layer and the strained semiconductor layer with impurities.

According to a sixteenth aspect of the present invention, in the method as described in any one of the first to fifteenth aspects, the heterojunction forming step is performed before a step of implanting ions used for a source diffusion layer and a drain diffusion layer in a manufacturing process of a MOSFET.

In a seventeenth aspect of the present invention, a semiconductor device includes: a semiconductor layer; and a gate insulating film that is positioned at a predetermined position on the semiconductor layer, in which the semiconductor layer has a strained layer that extends in a predetermined length in a part thereof including at least a part of the predetermined position and not covered by the gate insulating film, and a relaxed layer that is positioned to sandwich the strained layer.

According to an eighteenth aspect of the present invention, in the semiconductor device as described in the seventeenth aspect, the semiconductor layer is composed of Si or SiGe.

According to a nineteenth aspect of the present invention, in the semiconductor device as described in the eighteenth aspect, the strained semiconductor layer is composed of tensile strained Si or compressive strained SiGe.

According to a twentieth aspect of the present invention, in the semiconductor device as described in any one of the seventeenth to nineteenth aspects, the distance between a source-side heterojunction surface and a channel is smaller than the distance between a drain-side heterojunction surface and a channel.

Effects of the Invention

According to the present invention, by performing ion implantation from an upper surface of a substrate in which a strained semiconductor layer partially having a covering layer is provided on an insulating oxide layer, a heterojunction is formed between the strained semiconductor layer and the relaxed semiconductor layer composed of the same semiconductor material. This can solve various problems due to diffusion of foreign atoms and improve performance of the semiconductor device.

BRIEF DESCRIPTION OF THE DRAWINGS

FIG. 3 is a chart showing relaxation distribution in a mode in which a covering layer is in a single layer structure composed of a material with a thermal expansion rate greater than that of a strained semiconductor layer;

FIG. 4 is a chart showing distribution of recoil energy and ion density in ion implantation in a heterojunction forming step of the method according to the embodiments;

FIG. 7 is a chart showing a relationship between recoil energy in the ion implantation in the heterojunction forming step and band offset in an interface between source and channel.

EXPLANATION OF REFERENCE NUMERALS

Figure 1A:
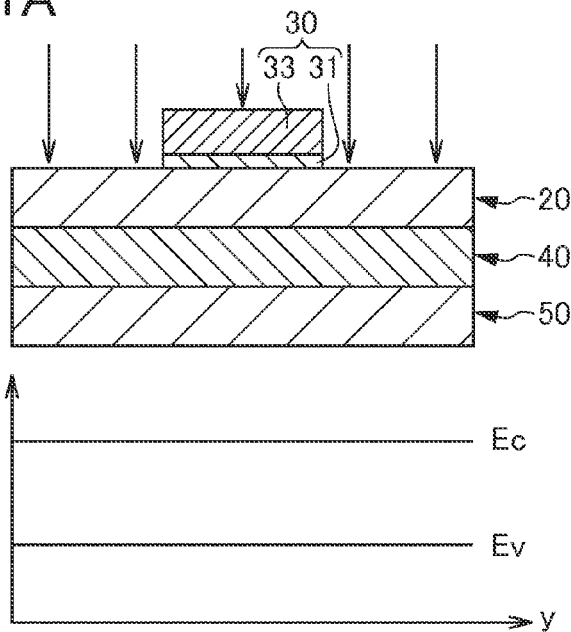
FIG. 1 is a diagram illustrating steps of the method for forming a semiconductor device structure according to an embodiment of the present invention.

20 Strained semiconductor layer
21 Strained semiconductor layer
23, 25 Relaxed semiconductor layer
30 Covering layer
40 Insulating oxide layer
50 Substrate

PREFERRED MODE FOR CARRYING OUT THE INVENTION

The embodiment of the present invention is described hereinafter with reference to the drawings.

Figure 1B:
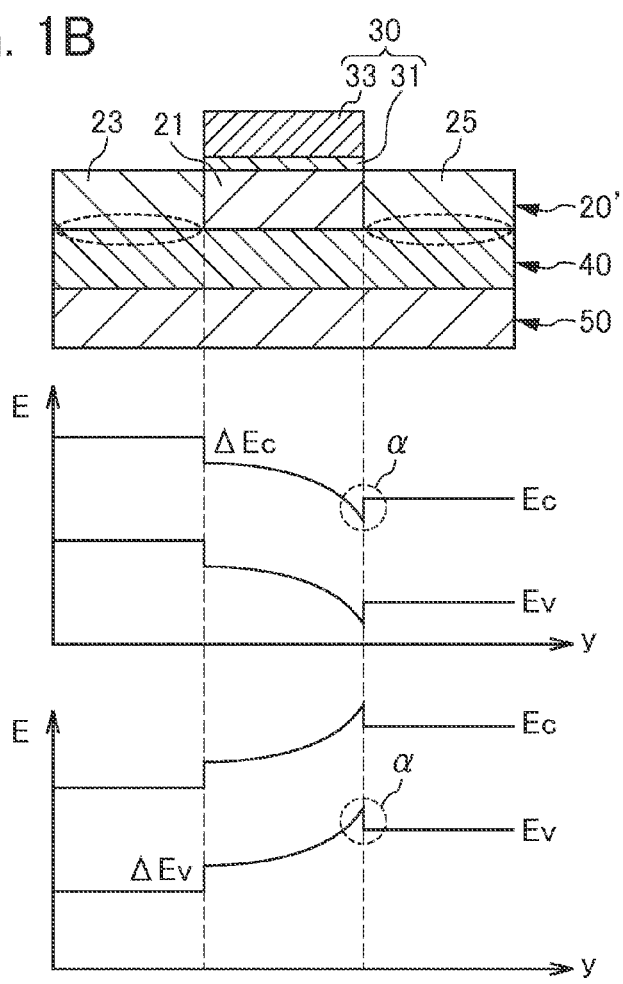

FIG. 1 is a diagram illustrating steps of the method for forming a semiconductor device structure according to an embodiment of the present invention. In this method, ion implantation is performed from an upper surface of a strained semiconductor layer 20 of a substrate 50 in which the strained semiconductor layer 20 partially having a covering layer 30 is provided on an insulating oxide layer 40 (A), to maintain a strained state of a first part of the strained semiconductor layer 20 shielded by the covering layer 30, and to relax the strained state of a second part of the strained semiconductor layer not shielded by the covering layer 30 so that the second part is changed into relaxed semiconductor layers 23, 25, thereby forming a heterojunction between the strained semiconductor layer 21 maintaining the strained state and the relaxed semiconductor layers 23, 25.

As a result, a bandgap (ΔEc or ΔEv) is formed in an interface between the relaxed semiconductor layer 23 and the strained semiconductor layer 21 of different crystal structures and the relaxed semiconductor layer 23 and the strained semiconductor layer 21 can function as source and channel in the semiconductor device. Here, unlike conventional cases, as the heterojunction is formed between the strained semiconductor layer 21 and the relaxed semiconductor layers 23, 25, various problems due to diffusion of foreign atoms can be solved and performance of the semiconductor device can be improved.

As used herein, a "semiconductor device structure" indicates a structure constituting at least a part of a semiconductor device, such as a structure constituting source and channel of a transistor and a structure constituting drain and/or gate.

In a mode in which the covering layer 30 has an oxide film 31 composed of an oxide of a semiconductor composing the strained semiconductor layer 20 (for example $SiO_2$), a structure is formed that includes not only source and channel of transistor but also a gate insulating film by the abovementioned method, thereby improving usability of the semiconductor device structure. In this case, the covering layer 30 must further include a member for blocking ions, the member preferably being a gate electrode 33 that covers the oxide film 31. As a result, a structure including both the gate insulating film and the gate electrode is formed, thereby further improving usability of the semiconductor device structure. Material for the gate electrode is not particularly limited, and can be polycrystalline Si, for example.

The covering layer can be in a single layer structure composed of a material with a thermal expansion rate greater or lower than that of the strained semiconductor layer. In this mode, by performing heating (for example an annealing step described later) after the heterojunction forming step, the covering layer shrinks or expands from the size of the strained semiconductor layer, allowing the strained semiconductor layer to be relaxed or the relaxed semiconductor layer to be strained to a degree corresponding to the shrinkage or expansion. As a result, a bandgap (ΔEc or ΔEv) in the interface between the relaxed semiconductor layer and the strained semiconductor layer can be made greater. FIG. 3 is a chart showing relaxation distribution in a mode in which a covering layer is in a single layer structure composed of a material with a thermal expansion rate greater than that of a strained semiconductor layer. By configuring the covering layer with a $SiO_2$ single layer, the covering layer shrinks from the size of the strained semiconductor layer (Si layer) during the annealing step and the relaxed semiconductor layer extends to a part covered by the covering layer. A bandgap ΔEc of 88.5 meV is thus realized. Measurement thereof is performed in a conventionally known strain distribution measurement method by Raman spectrometry.

The strained semiconductor layer 20, the insulating oxide film 40, and the substrate 50 that are subjected to ion implantation are not particularly limited and are obtained by: implanting high-concentration oxygen ions on the substrate; performing annealing (thermal process); and forming an embedded oxide film as the insulating oxide film 40 sandwiched by the strained semiconductor layer 20 and the substrate 50. In this case, the strained semiconductor layer 20 and the substrate 50 are composed of the same component and the insulating oxide film 40 is composed of oxide of the element composing the strained semiconductor layer 20 and the substrate 50 (for example $SiO_2$). However, the present invention is not limited thereto and the insulating oxide film 40 of the substrate 50 can be joined to the strained semiconductor layer 20, thereby forming a structure of: the substrate 50—the insulating oxide layer 40—the strained semiconductor layer 20. Here, although the material of the strained semiconductor layer 20 and the substrate 50 is not particularly limited, Si is preferably used. The strained semiconductor layer 20 can be composed of SiGe by ion implantation into the strained semiconductor layer 20 composed of Si.

Particularly, the strained semiconductor layer 20 is preferably composed of tensile strained Si or compressive strained SiGe. By configuring the strained semiconductor layer 20 with tensile strained Si, a semiconductor device structure for an n-MOS can be formed; and by configuring the strained semiconductor layer with compressive strained SiGe, a semiconductor device structure for a p-MOS can be formed. In other words, since a conductive band offset ΔEc (in the former case) is present in an interface between the strained semiconductor layer 21 and the relaxed semiconductor layer 23 (upper side in FIG. 1B), or a valence band offset ΔEv (in the latter case) is present in an interface between the strained semiconductor layer 21 and the relaxed semiconductor layer 23 (lower side in FIG. 1B), by implantation of ions of appropriate impurity (a trivalent element such as boron for the former case; a pentavalent element such as phosphorous for the latter case), the relaxed semiconductor layer 23, the strained semiconductor layer 21, and the relaxed semiconductor layer 25 can function as source, channel and drain, respectively. Although not particularly limited, by complementarily arranging and combining the n-MOS and p-MOS, a CMOS (Complementary Metal Oxide Semiconductor) can be manufactured.

Although the ions to be implanted are not particularly limited as long as they are implantable, from a viewpoint of reducing the effect of the ions remaining on the strained semiconductor layer 20 and the insulating oxide film 40 on semiconductor performance, the ions are preferably composed mainly or entirely of an element, excepting dopant, or an element composing the insulating oxide film 40 and the strained semiconductor layer 20. For example, in a case in which the strained semiconductor layer 20 is composed of Si or SiGe and the insulating oxide film 40 is composed of $SiO_2$ as described above, it is preferable that ions mainly or entirely composed of at least one element selected from O, Si and Ge are implanted.

Transfer (transition) to the relaxed semiconductor layer 23, 25 is considered to occur due to slippage of the strained semiconductor layer 20 from the insulating oxide film 40 on the interface therebetween (a part encircled by a dotted line in FIG. 1B), under the effect of the ion implantation. Therefore, in order to cause such a phenomenon, the recoil energy of ions in the interface between the strained semiconductor layer 20 and the insulating oxide film 40 needs to be at least greater than a value obtained by deducting the elastic energy of the strained semiconductor layer 20 from the binding energy between the strained semiconductor layer 20 and the insulating oxide film 40.

Particularly for effectively causing transition and for suppressing damage to the strained semiconductor layer 20 by keeping the recoil energy in the strained semiconductor layer 20 below a peak, it is preferable that the energy is controlled such that a peak of the recoil energy distribution of the ions is theoretically positioned in the interface between the strained semiconductor layer 20 and the insulating oxide film 40. Here, to control energy such that the peak of the recoil energy distribution of the ions is theoretically positioned in the interface is to adjust the acceleration energy of the ions to energy calculated such that the peak is theoretically positioned in the interface, giving consideration to the components and film thickness of the strained semiconductor layer 20, and does not always indicate that the actual peak of the recoil energy is positioned in the interface.

FIG. 4 is a chart showing distribution of recoil energy and ion density in ion implantation in a heterojunction forming step of the method according to the embodiments. This chart is obtained by using a simulation software SRIM, under conditions of: acceleration energy being 60 keV; the strained semiconductor layer 20 being a film of 60 nm in thickness composed of Si; and the insulating oxide film 40 being composed of $SiO_2$. In FIG. 4, a solid line indicates recoil energy distribution per one $O^+$ ion in a thickness direction; a dotted line indicates distribution of $O^+$ ion density in the thickness direction; and BOX indicates an embedded oxide film (an example of the insulating oxide film). This simulation result shows that the peak of the recoil energy tends to be positioned at a depth 0.6 times that of the ion density distribution peak. Therefore, by controlling the acceleration energy such that the peak of distribution of ion density positions at a depth of 1/0.6 times the thickness from surface to interface, the peak of the recoil energy distribution of ions can theoretically be positioned in the interface between the strained semiconductor layer 20 and the insulating oxide film 40. This tendency is not limited to the abovementioned conditions and can generally apply.

Such ion implantation may cause damage to the strained semiconductor layer 20 according to the recoil energy, giving a negative effect on performance of the semiconductor device. Given this, it is preferable to perform annealing after the ion implantation to recover the strained semiconductor layer 20 from damage and to suppress reduction in performance of the semiconductor device. The annealing can be preformed according to a conventionally known method such as furnace heating and heat wave processing.

Figure 5:
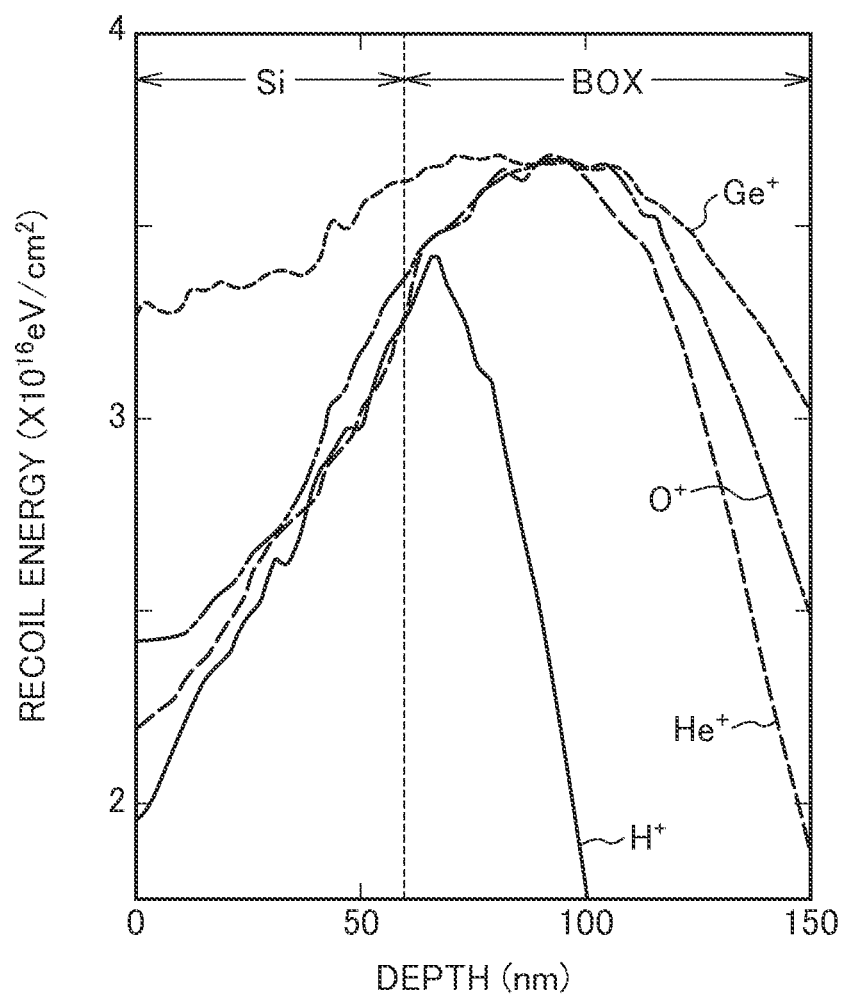
FIG. 5 is a chart showing a relationship between type of atom and distribution of recoil energy in the heterojunction forming step of the method according to the embodiments.

Damage to the strained semiconductor layer 20 according to the recoil energy can be suppressed also by implantation of ions mainly or entirely composed of at least one element selected from a group consisting of H, He, Li, Be and C. FIG. 5 is a chart showing a relationship between type of atom and distribution of recoil energy in the heterojunction forming step of the method according to the embodiments. As shown in FIG. 5, as the atomic weight of an ion to be implanted is reduced, even through the peak value of the recoil energy is almost the same, distribution of recoil energy is precipitous and can reduce in half the range, thereby reducing the recoil energy applied to a surface semiconductor layer and an embedded oxide film (an example of the insulating oxide film).

Figure 2A:
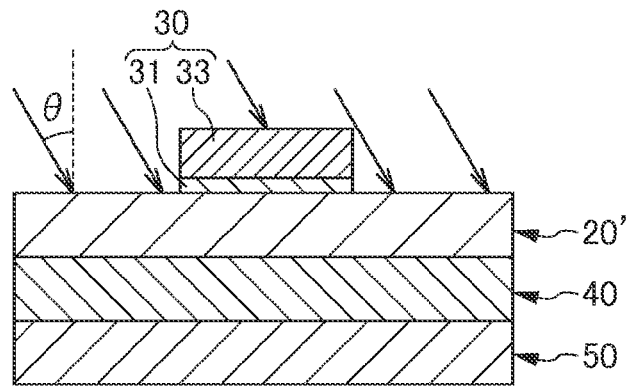
FIG. 2 is a diagram illustrating steps of the method for forming a semiconductor device structure according to another embodiment of the present invention.
Figure 2B:
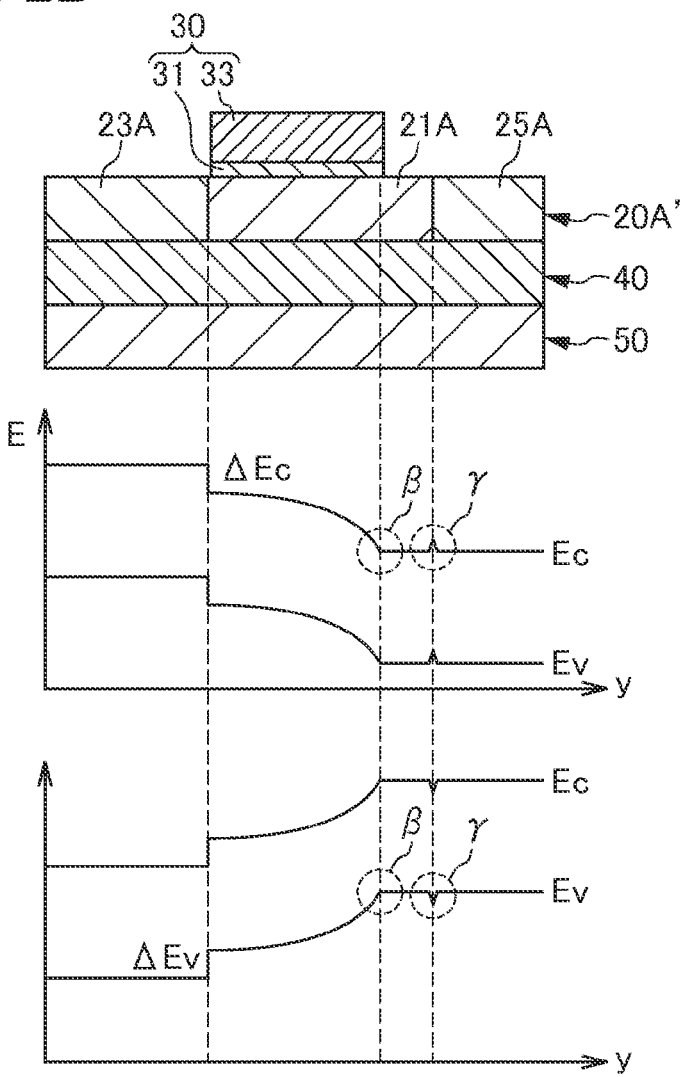

Again with reference to FIG. 1, after ion implantation, the heterojunction is formed not only between the strained semiconductor layer 21 and the relaxed semiconductor layer 23, but also between the strained semiconductor layer 21 and the relaxed semiconductor layer 25. As a result, an energy barrier (part α of FIG. 1B) is present between channel and drain of the semiconductor device and may hinder high-speed operation. Given this, as shown in FIG. 2A, the ion implantation is preferably performed from a direction at a predetermined angle Θ to a direction orthogonal to a surface of the strained semiconductor layer 20. A part of the semiconductor layer on a drain side (right side of FIG. 2) of a part covered by the covering layer 30 is masked from the ion implantation and not relaxed, for a predetermined length according to the predetermined angle Θ. As a result, the heterojunction on the drain side of the semiconductor device is spaced apart from a channel/drain interface and this reduces the energy barrier (part γ of FIG. 2B). Therefore, the band offset in the channel/drain interface is reduced (part β of FIG. 2B), allowing higher speed operation.

The predetermined angle Θ can be defined appropriately considering that an angle that is too small does not sufficiently provide the abovementioned effect. In addition, it is preferable to further include a step of adjusting energy of ion implantation according to the predetermined angle Θ. As a result, sufficient recoil energy can be provided to the interface between the strained semiconductor layer 20 and the insulating oxide film 40, at any predetermined angle Θ.

By implanting ions, which are used in a source diffusion layer and a drain diffusion layer, into the semiconductor layer 20A' thus formed, a semiconductor device (MOSFET) can be manufactured. The semiconductor device includes: the semiconductor layer 20A', and the covering layer 30 including a gate insulating film and a gate electrode that are positioned at predetermined positions on the semiconductor layer 20A', in which the semiconductor layer 20A' has a strained layer 21A that extends in a predetermined length in a part thereof including at least a part of the predetermined position and not covered by the gate insulating film, and a relaxed layers 23A, 25A that are positioned to sandwich the strained layer 21A (see FIG. 2B). In other words, the distance between a source-side (left side of FIG. 2B) heterojunction surface and a channel is smaller than the distance between a drain-side heterojunction surface and the channel. In such a semiconductor device, the energy barrier in the drain (part γ) is reduced, and the band offset in the channel/drain interface is reduced (part β), allowing higher speed operation.

As described above, the semiconductor layer 20A' is preferably composed of Si or SiGe, and more preferably composed of tensile strained Si or compressive strained SiGe. The ion implantation performed for the abovementioned heterojunction forming can be performed by a conventionally known method, for example by using a medium current ion implanter.

The present invention is not limited to the abovementioned embodiment, and modification, improvement and the like within the scope of objectives of the present invention are included in the present invention.

EXAMPLES

Using an ion implantation device, $O^+$ ions were implanted into the substrate illustrated in FIG. 1 (in which the strained semiconductor layer 20 and the substrate 50 are composed of Si; the insulating oxide film 40 is composed of $SiO_2$; in the covering layer 30, an Si layer is disposed on an $SiO_2$ layer; and the strained semiconductor layer 20 is 60 nm in thickness), with a dose amount $2\times10^{15}$ $cm^{-2}$ and acceleration energy 60 keV, in a direction orthogonal to the strained semiconductor layer 20. Thereafter, a furnace annealing process at 950° C. was performed on the substrate for 30 minutes.

Figure 6A:
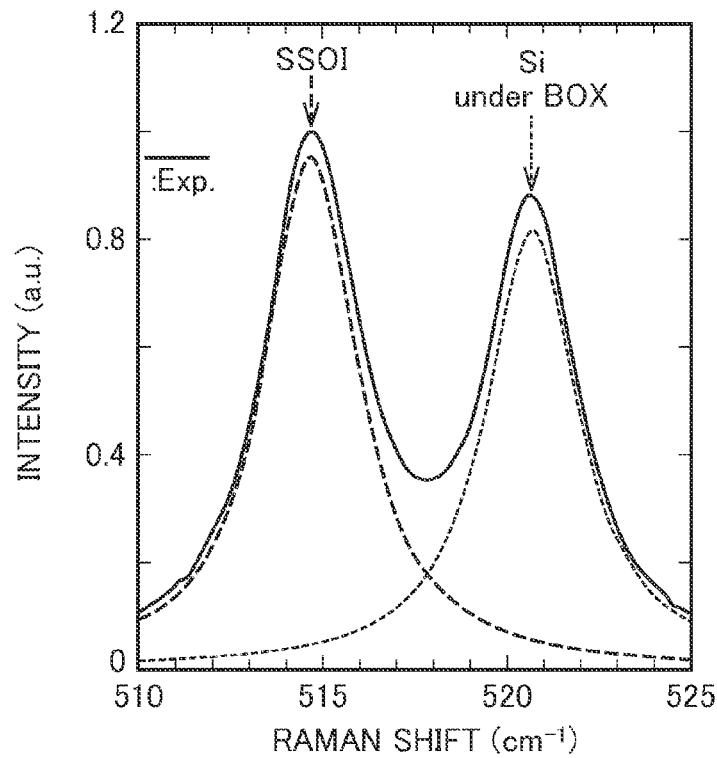
FIG. 6 is a chart showing a change in Raman shift of a semiconductor layer before (A) and after (B) the heterojunction forming step.
Figure 6B:
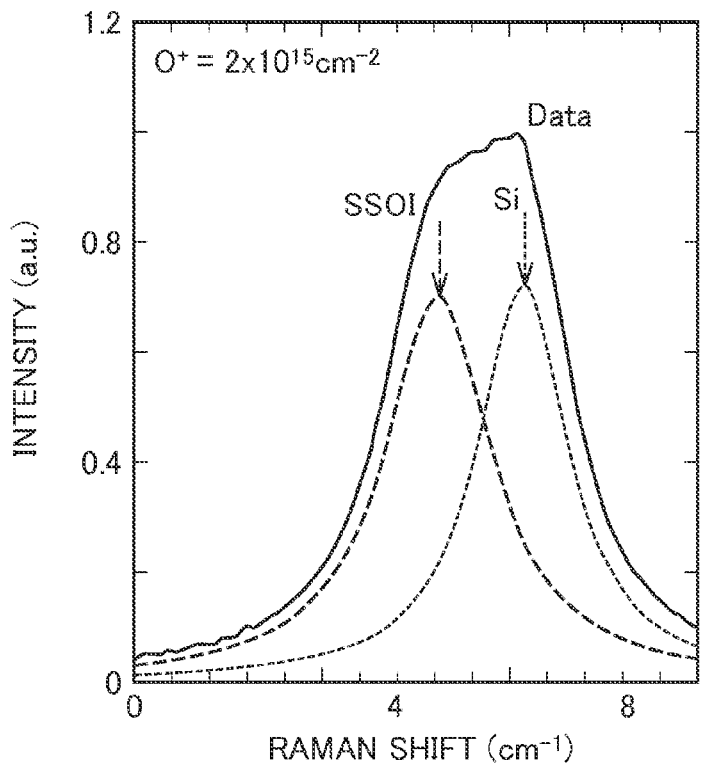
Figure 8:
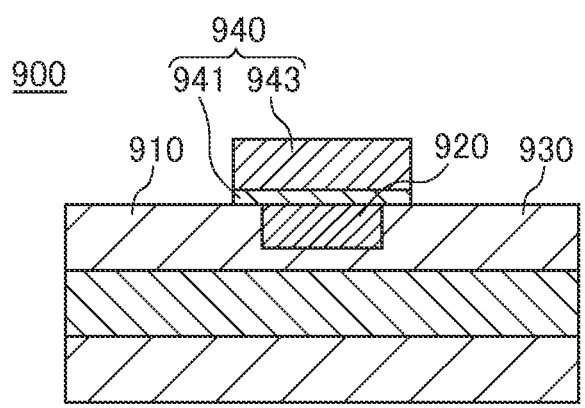
FIG. 8 is a schematic configuration diagram of a semiconductor device according to prior art.

Using a Raman scattering spectrometer, Raman shifts of the strained semiconductor layer 20 before the ion implantation and of the strained semiconductor layer 20' after the furnace annealing process were obtained. The results thereof are shown in FIGS. 6A and 6B. A peak of the tensile strained Si (SSOI in FIG. 6A), which was observed in the vicinity of 515 cm$^{-1}$ before the ion implantation, approached a peak of relaxed Si that is in the vicinity of 520 cm$^{-1}$ (FIG. 6B), after the ion implantation. As a result, it was confirmed that the strained semiconductor layer was transferred to the relaxed semiconductor layer by the ion implantation.

Thereafter, the ion implantation was performed by changing the recoil energy in various ways such as fixing the acceleration energy to 60 keV or fixing the dose amount to 2×10$^{15}$ cm$^{-2}$, and band offsets in an interface between source and channel that were formed were estimated from Raman shifts. In addition, the ion implantation was performed on a substrate after Ge ion implantation to the strained semiconductor layer 20 and the annealing process by changing the recoil energy in various ways such as fixing the acceleration energy to 60 keV or fixing the dose amount to 2×10$^{15}$ cm$^{-2}$, and band offsets in an interface between source and channel that were formed were estimated from Raman shifts. Relationships between the band offsets thus obtained and the recoil energy are shown in FIG. 7. Estimation of the band offsets from Raman shifts was based on findings in C. K. Maiti, "Strained silicon heterostructures", IEE, 2001.

As shown in FIG. 7, it was determined that the band offset of both of n-MOS and p-MOS can be adjusted by adjusting the recoil energy. The present embodiment showed that, by optimizing the recoil energy, band offsets of no greater than 70 meV in an n-MOS and no greater than 160 meV in a p-MOS can be obtained.

The invention claimed is:

1. A method for forming a semiconductor device structure, comprising a heterojunction forming step wherein: ion implantation is performed from an upper surface of a substrate in which a strained semiconductor layer partially having a covering layer is provided, said strained semiconductor layer being positioned on an insulating oxide layer such that said covering layer and insulating oxide layer are on opposite sides of said strained semiconductor layer, to maintain a strained state of a first part of the strained semiconductor layer shielded by the covering layer and to relax the strained state of a second part of the strained semiconductor layer not shielded by the covering layer and the second part is changed into a relaxed semiconductor layer, thereby forming a heterojunction between the strained semiconductor layer maintaining the strained state and the relaxed semiconductor layer, wherein energy of ion implantation is adjusted such that a peak of recoil energy distribution of ions is theoretically positioned in an interface between the strained semiconductor layer and the insulating oxide layer.

2. The method according to claim 1, wherein the covering layer is in a single layer structure composed of a material with a thermal expansion rate greater or lower than that of the strained semiconductor layer.

3. The method according to claim 1, wherein the ion implantation is implantation of ions mainly or entirely composed of an element other than a dopant.

4. The method according to claim 1, wherein the ion implantation is implantation of ions mainly or entirely composed of an element composing the insulating oxide layer and the strained semiconductor layer.

5. The method according to claim 1, wherein the strained semiconductor layer is composed of Si or SiGe.

6. The method according to claim 5, wherein the strained semiconductor layer is composed of tensile strained Si or compressive strained SiGe.

7. The method according to claim 5, wherein the ion implantation is implantation of ions mainly or entirely composed of at least one element selected from a group consisting of O, Si and Ge.

8. The method according to claim 5, wherein the ion implantation is implantation of ions mainly or entirely composed of at least one element selected from a group consisting of H, He, Li, Be and C.

9. The method according to claim 1 further comprising an annealing step after the ion implantation.

10. The method according to claim 1, wherein the ion implantation is performed from a direction at a predetermined angle to a direction orthogonal to a surface of the strained semiconductor layer.

11. The method according to claim 10 further comprising a step of adjusting energy of ion implantation according to the predetermined angle.

12. The method according to claim 1, wherein the heterojunction forming step is performed before a step of implanting ions used for a source diffusion layer and a drain diffusion layer in a manufacturing process of a MOSFET.

13. The method according to claim 1, wherein the covering layer has an oxide layer composed of an oxide of the semiconductor.

14. The method according to claim 13, wherein the covering layer further comprises a gate electrode that covers the oxide layer.

15. The method according to claim 1 further comprising a step of forming a source and a drain by doping the relaxed semiconductor layer, or the relaxed semiconductor layer and the strained semiconductor layer with impurities.

16. A semiconductor device comprising: a semiconductor layer; and a gate insulating film that is positioned at a predetermined position on the semiconductor layer,
wherein the semiconductor layer has a strained layer that extends in a predetermined length in a part thereof including at least a part of the predetermined position and not covered by the gate insulating film, and two relaxed layers that are positioned to sandwich the strained layer,
wherein heterojunction is formed between the strained layer and the relaxed layer,
wherein the strained layer is positioned between the relaxed layers on a source side and on a drain side, and wherein the distance between a source-side heterojunction surface and a channel is smaller than the distance between a drain-side heterojunction surface and a channel.

* * * * *